US012025656B2

(12) United States Patent
Won et al.

(10) Patent No.: US 12,025,656 B2
(45) Date of Patent: *Jul. 2, 2024

(54) SEMICONDUCTOR MODULE INCLUDING SEMICONDUCTOR PACKAGE AND SEMICONDUCTOR PACKAGE

(71) Applicant: SAMSUNG ELECTRONICS CO., LTD., Suwon-si (KR)

(72) Inventors: Seyoung Won, Seoul (KR); Dan-Kyu Kang, Anyang-si (KR); Sang-Yeol Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 261 days.

This patent is subject to a terminal disclaimer.

(21) Appl. No.: 17/107,244

(22) Filed: Nov. 30, 2020

(65) Prior Publication Data

US 2021/0080501 A1 Mar. 18, 2021

Related U.S. Application Data

(63) Continuation of application No. 15/715,625, filed on Sep. 26, 2017, now Pat. No. 10,908,209.

(30) Foreign Application Priority Data

Sep. 28, 2016 (KR) .......................... 10-2016-0124747

(51) Int. Cl.
*G01T 1/08* (2006.01)
*G01K 1/02* (2021.01)
(Continued)

(52) U.S. Cl.
CPC ........... *G01R 31/2881* (2013.01); *G01K 1/02* (2013.01); *G01K 11/12* (2013.01); *G01N 21/78* (2013.01); *G01R 31/2874* (2013.01); *G01R 31/2879* (2013.01); *G01R 31/44* (2013.01); *G01T 1/08* (2013.01); *G01T 1/16* (2013.01); *H01L 23/564* (2013.01); *G01N 2021/7796* (2013.01); *G01N 21/81* (2013.01); *H01L 25/0655* (2013.01);
(Continued)

(58) Field of Classification Search
CPC ................................ B65D 81/266; G01T 1/08
See application file for complete search history.

(56) References Cited

U.S. PATENT DOCUMENTS

| 4,838,664 A | 6/1989 | Graham | |
|---|---|---|---|
| 4,891,250 A * | 1/1990 | Weibe | G01K 11/16 428/209 |

(Continued)

FOREIGN PATENT DOCUMENTS

| JP | 2004-325417 A | 11/2004 |
|---|---|---|
| KR | 10-2010-0111093 A | 10/2010 |

OTHER PUBLICATIONS

Micron Technology, Inc., "Customer Service Note; Micron® Component and Module Packaging", CSN-16: Micron Component and Module Packaging Introduction, 2004, pp. 1-21.

*Primary Examiner* — Jonathan M Hurst
(74) *Attorney, Agent, or Firm* — Sughrue Mion, PLLC (57) ABSTRACT

A semiconductor module includes a substrate; a plurality of semiconductor packages provided on the substrate; and an environment information indicator configured to display information related to an environment surrounding the plurality of semiconductor packages.

8 Claims, 9 Drawing Sheets

(51) Int. Cl.
  *G01K 11/12*   (2021.01)
  *G01N 21/78*   (2006.01)
  *G01R 31/28*   (2006.01)
  *G01R 31/44*   (2020.01)
  *G01T 1/16*    (2006.01)
  *H01L 23/00*   (2006.01)
  *G01N 21/77*       (2006.01)
  *G01N 21/81*       (2006.01)
  *H01L 25/065*      (2023.01)

(52) U.S. Cl.
  CPC ............... *H01L 2224/48091* (2013.01); *H01L 2224/48247* (2013.01); *H01L 2924/181* (2013.01)

(56) References Cited

U.S. PATENT DOCUMENTS

| | | | |
|---|---|---|---|
| 4,971,196 A | 11/1990 | Kitamura | |
| 5,295,297 A | 3/1994 | Kitamura et al. | |
| 5,644,899 A | 7/1997 | Truesdale | |
| 5,673,028 A | 9/1997 | Levy | |
| 5,875,892 A | 3/1999 | Martin | |
| 6,219,215 B1 | 4/2001 | Bertin et al. | |
| 6,616,332 B1 | 9/2003 | Renken | |
| 7,513,682 B2 * | 4/2009 | McClure | H05K 1/0269 374/162 |
| 7,764,184 B2 | 7/2010 | Dobbs et al. | |
| 8,205,107 B2 | 6/2012 | Berke et al. | |
| 8,289,666 B2 | 10/2012 | Shin | |
| 8,590,332 B2 | 11/2013 | Wyatt | |
| 9,506,815 B2 | 11/2016 | Moore et al. | |
| 2002/0000184 A1 | 1/2002 | Paton et al. | |
| 2003/0115978 A1 | 6/2003 | Moehnke | |
| 2003/0193032 A1 | 10/2003 | Marshall | |
| 2005/0189629 A1 | 9/2005 | Ito et al. | |
| 2006/0155517 A1 | 7/2006 | Dobbs et al. | |
| 2006/0214666 A1 | 9/2006 | Chou | |
| 2008/0129441 A1 | 6/2008 | Darr | |
| 2009/0108983 A1 * | 4/2009 | Darr | H01H 85/30 337/243 |
| 2009/0289202 A1 | 11/2009 | Yakimov et al. | |
| 2010/0051692 A1 | 3/2010 | Knudson et al. | |
| 2010/0191991 A1 | 7/2010 | Berke et al. | |
| 2010/0254051 A1 | 10/2010 | Jeon et al. | |
| 2010/0328835 A1 | 12/2010 | Shin | |
| 2011/0029150 A1 | 2/2011 | Wyatt | |
| 2014/0105244 A1 | 4/2014 | Moore et al. | |
| 2014/0154808 A1 | 6/2014 | Patel | |
| 2015/0173178 A1 | 6/2015 | Morzos | |
| 2015/0355253 A1 | 12/2015 | Ayotte et al. | |
| 2016/0076947 A1 | 3/2016 | Ribi | |
| 2016/0285255 A1 | 9/2016 | O'Donnell | |

* cited by examiner

SEMICONDUCTOR MODULE INCLUDING SEMICONDUCTOR PACKAGE AND SEMICONDUCTOR PACKAGE

CROSS-REFERENCE TO THE RELATED APPLICATION

This U.S. non-provisional patent application is a continuation of U.S. application Ser. No. 15/715,625, filed Sep. 26, 2017, which claims priority from Korean Patent Application No. 10-2016-0124747, filed on Sep. 28, 2016, in the Korean Intellectual Property Office, the disclosure of which is hereby incorporated by reference in its entirety.

BACKGROUND

Embodiments of the inventive concepts relate to a semiconductor circuit and, more particularly, to a semiconductor module including a semiconductor package or a plurality of semiconductor packages.

Semiconductor devices are distributed in the form of a semiconductor module or a semiconductor package. The semiconductor package has a shape in which a semiconductor die is encapsulated by a housing. The semiconductor module has a shape in which one or more semiconductor packages are disposed on a printed circuit board. The semiconductor packages and the semiconductor modules may be delivered to end users or vendors through various distribution processes and through distribution channels.

The semiconductor modules or the semiconductor packages delivered to the end users or vendors may be defective. When the delivered semiconductor module or the semiconductor package is determined as a defective product, a manufacturer of the semiconductor module or the semiconductor package needs to identify the cause or causes of the defect and to correct the identified cause or causes.

Defects occurring in the semiconductor modules or the semiconductor packages may include defects occurring in the manufacturing process thereof and/or defects occurring in the distribution process thereof. The defects occurring in the manufacturing process may be corrected by the improvement of the manufacturing process, and the defects occurring in the distribution process may be corrected by the improvement of the distribution process. Because means for correcting the defects are different from each other between the defects occurring in the manufacturing process and the defects occurring in the distribution process, a manufacturer of the semiconductor module or the semiconductor package should determine whether the cause of the defect is due to mishap in the manufacturing process or the distribution process. Thus, there is a need for a new apparatus or method for detecting and/or displaying environment information negatively affecting the semiconductor module or the semiconductor package in the distribution process of the semiconductor module or the semiconductor package.

SUMMARY

Embodiments of the inventive concepts may provide a semiconductor module and a semiconductor package which is capable of showing environment information related to the semiconductor module and the semiconductor package in a distribution process.

In an aspect of an example embodiment, a semiconductor module may include a substrate, a plurality of semiconductor packages attached to the substrate, and an environment information indicator showing information on an environment to which the semiconductor packages belong, in a non-electric manner.

In an aspect of another example embodiment, a semiconductor module may include a substrate, a plurality of semiconductor packages attached to the substrate, and an environment information indicator showing at least one of a temperature of an environment to which the semiconductor packages belong, humidity of the environment to which the semiconductor packages belong, whether or not an X-ray is irradiated to the semiconductor packages, or electrical overstress (EOS) applied to the semiconductor packages, in a non-electric manner.

In an aspect of another example embodiment, a semiconductor package may include one or more semiconductor dies, a housing surrounding the semiconductor dies, a plurality of conductive materials penetrating the housing so as to be connected to the semiconductor dies, and an environment information indicator attached to the housing. The environment information may show information on an environment to which the semiconductor packages belong, in a non-electric manner. The environment information indicator may include a plurality of temperature indicators sequentially discolored as temperature increases, a plurality of humidity indicators sequentially discolored as humidity increases, a plurality of X-ray sensitive indicators disposed with caps having X-ray transmittances different from each other, and a plurality of fuses sequentially blown as electrical overstress (EOS) increases.

In an aspect of another example embodiment, a semiconductor module may include a substrate; a plurality of semiconductor packages provided on the substrate; and an environment information indicator configured to display information related to an environment surrounding the plurality of semiconductor packages.

In an aspect of another example embodiment, a semiconductor module may include a substrate; a plurality of semiconductor packages provided on the substrate; and an environment information indicator configured to display at least one of a temperature of an environment surrounding the semiconductor packages, humidity of the environment surrounding the semiconductor packages, an X-ray of the environment being irradiated to the semiconductor packages, and electrical overstress (EOS) applied to the semiconductor packages.

In an aspect of another example embodiment, a semiconductor package may include at least one semiconductor die; a housing surrounding the at least one semiconductor die; a plurality of conductive materials connecting the housing the at least one semiconductor die to each other; and an environment information indicator provided on the housing, the environment information indicator configured to display information related to an environment surrounding the semiconductor packages. The environment information indicator may include: a plurality of temperature indicators sequentially discolored as temperature of the environment increases; a plurality of humidity indicators sequentially discolored as humidity of the environment increases; a plurality of X-ray sensitive indicators, each of plurality of X-ray sensitive indicators including a cap having X-ray transmittance different from one another of the plurality of X-ray sensitive indicators; and a plurality of fuses sequentially blown as electrical overstress (EOS) of the environment increases.

In an aspect of another example embodiment, a semiconductor module may include a plurality of semiconductor packages provided on a substrate; and an environment information indicator provided on the substrate and configured to collect and display information related to surroundings of the plurality of semiconductor packages

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, the inventive concept of the disclosure will now be described more fully hereinafter with reference to the accompanying drawings, in which the embodiments are shown. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Figure 1:
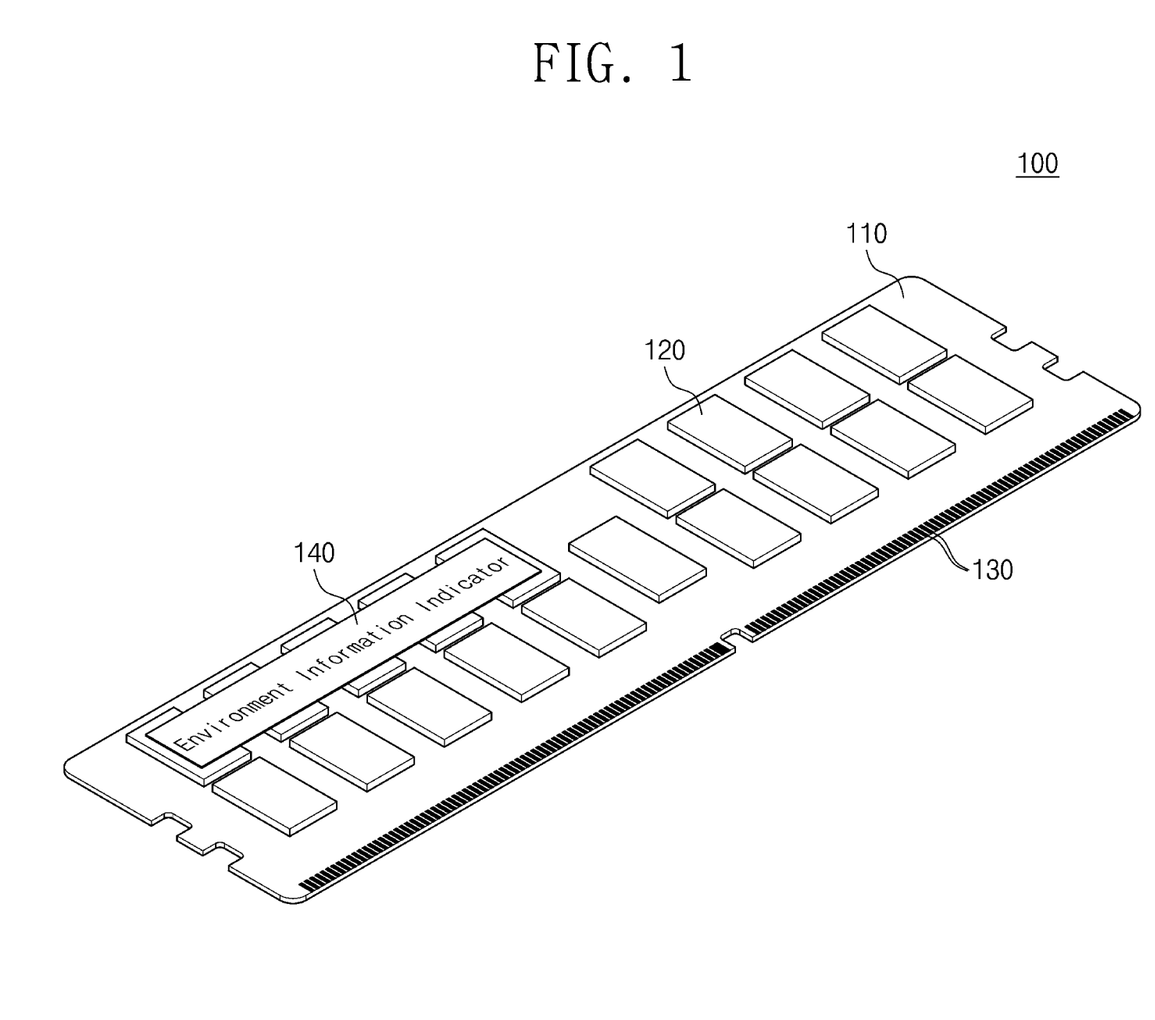
FIG. 1 illustrates a semiconductor module according to an example embodiment.

FIG. 1 illustrates a semiconductor module 100 according to an example embodiment of the inventive concepts. For example, FIG. 1 illustrates a dynamic random access memory (DRAM) module based on a dual in-line memory module (DIMM). However, the semiconductor module 100 according to the inventive concepts is not limited to the DRAM module based on the DIMM.

Referring to FIG. 1, the semiconductor module 100 may include a substrate 110, a plurality of semiconductor packages 120, connection pins 130, and an environment information indicator 140.

The substrate 110 may be a printed circuit board (PCB). For example, the substrate 110 may include connecting terminals (not shown) coupled to connecting pins (not shown) or solder balls (not shown) of the semiconductor packages 120, and printed circuit wires (not shown) connecting the connecting terminals to the connection pins 130. The substrate 110 may further include sub-connecting terminals (not shown) which are connected to the connecting terminals or the connection pins 130 and which can be coupled to discrete elements such as a capacitor, a diode, and a resistor.

Each of the semiconductor packages 120 may be the same kind of semiconductor package or may be different kinds of semiconductor packages from one another. The semiconductor packages 120 may be attached to the connecting terminals of the substrate 110.

The connection pins 130 may be formed to be connected to connection slots of a host device (not shown) incorporating the semiconductor module 100.

The environment information indicator 140 may collect and/or display information of environment experienced by or applied to the semiconductor module 100 or the semiconductor packages 120 of the semiconductor module 100. For example, the environment information indicator 140 may collect and/or display two or more pieces of environment information. The environment information indicator 140 may collect and/or display the information, which is adversely affecting the semiconductor module 100 or the semiconductor packages 120, from the two or more pieces of environment information indicating its highest absolute value (e.g., the highest temperature or the lowest temperature surrounding the semiconductor module 100 or the semiconductor packages 120). The environment information indicator 140 may visibly display the environment information such that a user can easily identify the environment information and identify the cause or the causes of the defect. To collect or display the environment information of a distribution process in which power may not be available to the semiconductor module 100, the environment information indicator 140 may be a non-electric device operating without being supplied with electrical power.

For example, the semiconductor module 100 may be determined as a defective product when the semiconductor module 100 is delivered to an end user or a vendor. A manufacturer of the semiconductor module 100 may collect the semiconductor module 100 to identify a cause (or causes) of a defect of the semiconductor module 100. A manufacturer may refer to the environment information indicator 140 to determine whether there is a severe environmental effect which may have caused the defect in the semiconductor module 100 or the semiconductor packages 120 during the distribution process. When the severe environment surrounding the semiconductor module 100 or the semiconductor packages 120 exists, the cause/causes of the defect may be traced in the distribution process. When the severe environment does not exist in the distribution process, the cause of the defect may be attributed to the manufacturing process instead of the distribution process. In other words, because a manufacturer refers to the environment information indicator 140, it may be easier to determine the cause/causes of the defect of the semiconductor module 100 or the semiconductor packages 120, and the cause/causes of the defect may be more easily corrected.

The semiconductor module 100 may be determined as a defective product while an end user uses the semiconductor module 100. A manufacturer or a user of the semiconductor module 100 may refer to the environment information indicator 140 to identify the cause of the defect of the semiconductor module 100. For example, a manufacturer or a user may refer to the environment information indicator 140 to determine whether an environment in which the semiconductor module 100 is used is severe enough to cause the defect in the semiconductor module 100 or the semiconductor packages 120. When the semiconductor module 100 was determined to have been used in the severe/harsh environment, the use environment may be determined as the cause of the defect. When the semiconductor module 100 was not used in the severe/harsh environment, deterioration or lifetime of the semiconductor module 100 or the semiconductor packages 120 may be determined as the cause of the defect instead of the environmental effects. In other words, whether or not the use environment of the semiconductor module 100 needs to be improved may be determined by referring to the environment information indicator 140.

As described above, when the environment information indicator 140 is mounted on the semiconductor module 100, the distribution process or the use environment of the semiconductor module 100 may be collected and it is possible to determine whether the environment in the distribution process or the use environment needs to be improved. When the environment information indicator 140 is non-electric (i.e., non-electrically-powered indicator), environment information when power is not supplied to the semiconductor module 100 may also be determined or identified by the environment information indicator 140. In other words, because the environment information indicator 140 is used without having to provide electrical power to the environment information indicator 140, the environment of the semiconductor module 100 may be improved and reliability of the semiconductor module 100 may be improved.

For example, the environment information indicator 140 may be attached to the printed circuit board 110 or the semiconductor packages 120.

Figure 2:
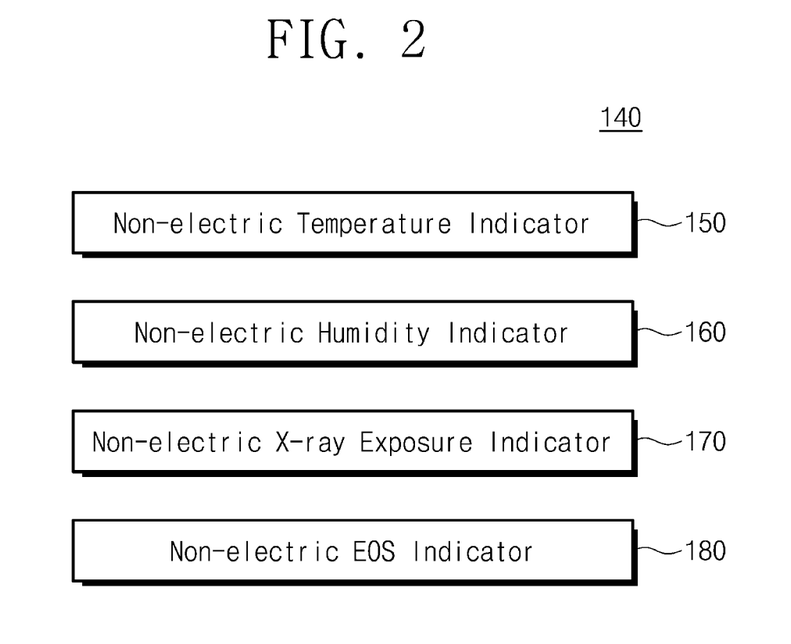
FIG. 2 illustrates an environment information indicator according to an example embodiment.

FIG. 2 illustrates an environment information indicator 140 according to an example embodiment of the inventive concepts. Referring to FIG. 2, the environment information indicator 140 may include a non-electric temperature indicator 150, a non-electric humidity indicator 160, a non-electric X-ray exposure indicator 170, and a non-electric electrical overstress (non-electric EOS) indicator 180.

The non-electric temperature indicator 150 does not require an external power source and may display a temperature in a non-electric manner. For example, the non-electric temperature indicator 150 may visibly display the highest (or lowest) temperature experienced to date.

The non-electric humidity indicator 160 does not require, similar to the non-electric temperature indicator 150, an external power source and may display humidity in a non-electric manner. For example, the non-electric humidity indicator 160 may visibly display the highest (or lowest) humidity experienced to date.

The non-electric X-ray exposure indicator 170 does not require, similar to the non-electric temperature indicator 150 and the non-electric humidity indicator 160, an external power source and may display the degree of X-ray exposure in a non-electric manner. For example, the non-electric X-ray exposure indicator 170 may display whether or not an X-ray is irradiated, or a flux of the highest X-ray irradiated to date.

The non-electric EOS indicator 180 does not require an external power source and may display EOS in a non-electric manner. For example, the non-electric EOS indicator 180 may visibly display or show the highest (or lowest) EOS experienced to date.

FIG. 2 illustrates the environment information indicator 140 including four different and distinct indicators as an example. However, example embodiments of the inventive concepts are not limited to the kinds and the number of the indicators included in the environment information indicator 140. In certain example embodiments, one or some of the indicators illustrated in FIG. 2 may be omitted or be replaced with different types of indicators, or new indicators of different types from the four described above may be added to the environment information indicator 140 illustrated in FIG. 2. The indicators of FIG. 2 may display environment information in a directly visible manner or in an indirectly visible manner. The directly visible indicators may visibly show the environment information without an additional process or operation. The indirectly visible indicators may visibly show the environment information through a subsequent process or operation.

Figure 3:
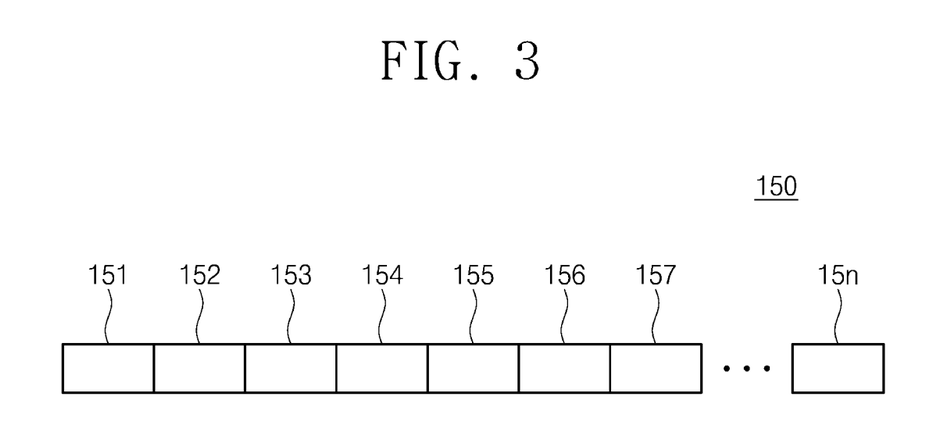
FIG. 3 illustrates an example of a temperature indicator of FIG. 2.

FIG. 3 illustrates an example of the non-electric temperature indicator 150 of FIG. 2. Referring to FIG. 3, the non-electric temperature indicator 150 may include a plurality of indicators 151 to 15$n$ (where "n" denotes a positive integer). Generally, as an ambient temperature increases, performance of the semiconductor module 100 or the semiconductor packages 120 may be deteriorated and the possibility of damaging the semiconductor module 100 or the semiconductor packages 120 may increase. Thus, the non-electric temperature indicator 150 may show environment information related to a temperature surrounding the semiconductor module 100 or the semiconductor packages 120.

Each of the plurality of indicators 151 to 15$n$ may be discolored when the ambient temperature reaches a critical value (or a predetermined threshold value). The plurality of indicators 151 to 15$n$ may have critical values different from one another. For example, the critical value of a $k^{th}$ indicator (where "k" is a positive integer greater than 1 and equal to or less than "n") may be greater than the critical value of a $k-1^{th}$ indicator. In other words, the plurality of indicators 151 to 15$n$ may be sequentially discolored as a temperature increases.

Each of the plurality of indicators 151 to 15$n$ may be irreversibly discolored. A color of each of the indicators may be discolored from an original color of each of the indicators when a temperature becomes higher than the critical value for each of the plurality of indicators 151 to 15$n$, and the color of each of the indicators 151-15$n$ may not return to the original color even if the temperature becomes lower than the critical value for respective indicator. In other words, a temperature when the ambient temperature was the highest (i.e., the worst) may be visibly indicated based on discolored ones and non-discolored ones of the plurality of indicators 151 to 15$n$.

Figure 4:
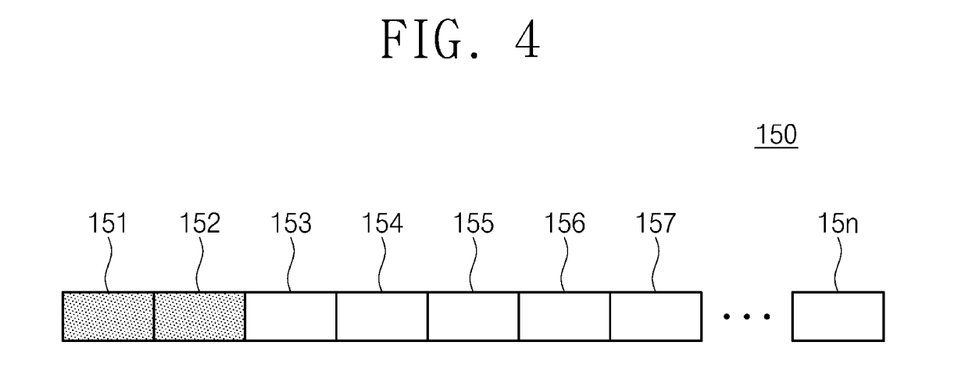
FIGS. 4 and 5 illustrate examples in which some of indicators are discolored.

FIGS. 4 and 5 illustrate example embodiments in which some of the indicators 151 to 15$n$ are discolored. Referring to FIG. 4, colors of first and second indicators 151 and 152 of the non-electric temperature indicator 150 may be discolored. At this time, the worst environment (e.g., the highest temperature) experienced by the non-electric temperature indicator 150 may be determined as a value (e.g., a temperature) that is equal to or greater than the critical value of the second indicator 152 and less than the critical value of a third indicator 153.

Figure 5:
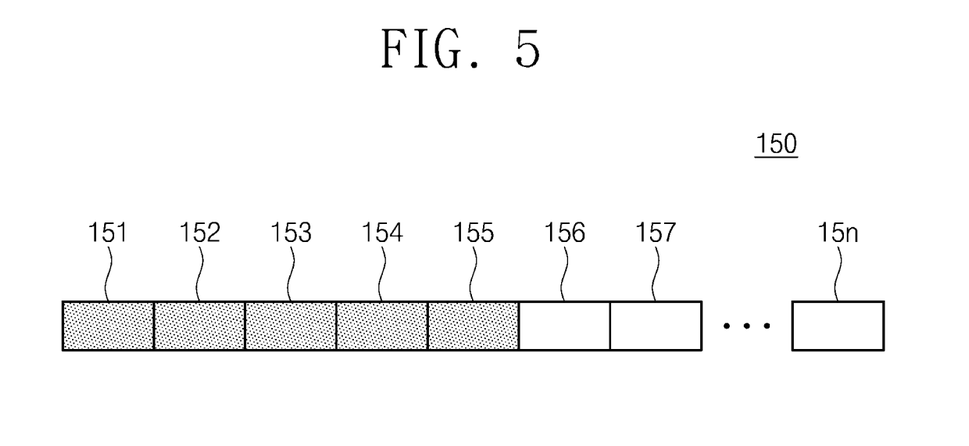

Referring to FIG. 5, colors of first through fifth indicators 151, 152, 153, 154 and 155 of the non-electric temperature indicator 150 may be discolored. At this time, the worst environment (e.g., the highest temperature) experienced by the non-electric temperature indicator 150 may be determined as a value (e.g., a temperature) that is equal to or greater than the critical value of the fifth indicator 155 and less than the critical value of a sixth indicator 156.

For example, the plurality of indicators 151 to 15$n$ may respectively include thermochromic inks (or thermosensitive inks) having critical values different from one another. However, materials of the indicators 151 to 15$n$ discolored according to a temperature are not limited to the thermochromic inks (or the thermosensitive inks).

In FIGS. 3 to 5, the non-electric temperature indicator 150 shows a degree of the increase in the ambient temperature. Alternatively, in certain example embodiments, the non-electric temperature indicator 150 may show a degree of a decrease in the ambient temperature. For example, the non-electric temperature indicator 150 may include a plurality of indicators sequentially irreversibly discolored as the ambient temperature decreases. In certain example embodiments, the non-electric temperature indicator 150 may be applied to show both information on an increasing ambient temperature and information on a decreasing ambient temperature. For example, the non-electric temperature indicator 150 may include a plurality of first indicators and a plurality of second indicators. The plurality of first indicators may be sequentially irreversibly discolored as the ambient temperature increases, and the plurality of second indicators may be sequentially irreversibly discolored as the ambient temperature decreases.

Figure 6:
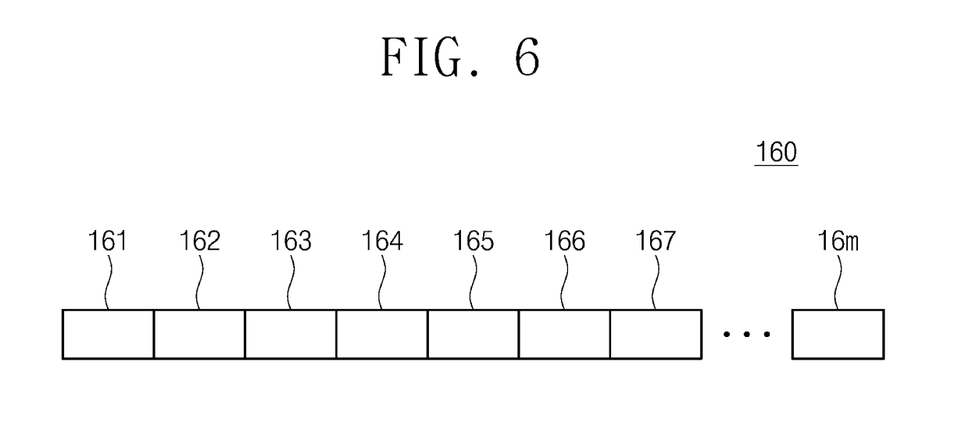
FIG. 6 illustrates an example of a non-electric humidity indicator described in FIG. 2.

FIG. 6 illustrates an example of the non-electric humidity indicator 160 illustrated in FIG. 2. Referring to FIG. 6, the non-electric humidity indicator 160 may include a plurality of indicators 161 to 16m (where "m" denotes a positive integer). Generally, as ambient humidity increases, performance of the semiconductor module 100 or the semiconductor packages 120 may be deteriorated and the possibility of damaging the semiconductor module 100 or the semiconductor packages 120 may increase. Thus, the non-electric humidity indicator 160 may show environment information related to humidity surrounding the semiconductor module 100 or the semiconductor packages 120.

Each of the plurality of indicators 161 to 16m may be discolored when the ambient humidity reaches a critical value of each of the plurality of indicators 161 to 16m. The plurality of indicators 161 to 16m may have critical values different from one another. For example, the critical value of a $k^{th}$ indicator (where "k" is a positive integer greater than 1 and equal to or less than "m") may be greater than the critical value of a $k-1^{th}$ indicator. In other words, the plurality of indicators 161 to 16m may be sequentially discolored as humidity increases.

Each of the plurality of indicators 161 to 16m may be irreversibly discolored. For example, a color of each of the indicators may be discolored from an original color of each of the indicators when humidity becomes higher than the critical value, and the color of each of the indicators may not return to the original color even though the humidity becomes lower than the critical value. In other words, the highest ambient humidity may be visibly shown through discolored ones and non-discolored ones of the plurality of indicators 161 to 16m.

In certain example embodiments, each of the plurality of indicators 161 to 16m may be reversibly discolored. The color of each of the indicators 161 to 16m may be discolored from the original color when the humidity becomes higher than the critical value, and the color of each of the indicators may return to the original color when the humidity becomes lower than the critical value. In this case, the plurality of indicators 161 to 16m may be provided inside a housing (e.g., a transparent housing) that blocks or prevents evaporation of absorbed moisture, and an opening for delivering the humidity of an external environment may be provided in the housing. In other words, the humidity of the external environment may be delivered to the plurality of indicators 161 to 16m through the opening, and the humidity absorbed in the plurality of indicators 161 to 16m may not be evaporated by the housing. In other words, humidity when the ambient humidity was the highest (i.e., the worst environment) may be visibly shown through discolored ones and non-discolored ones of the plurality of indicators 161 to 16m.

Figure 7:
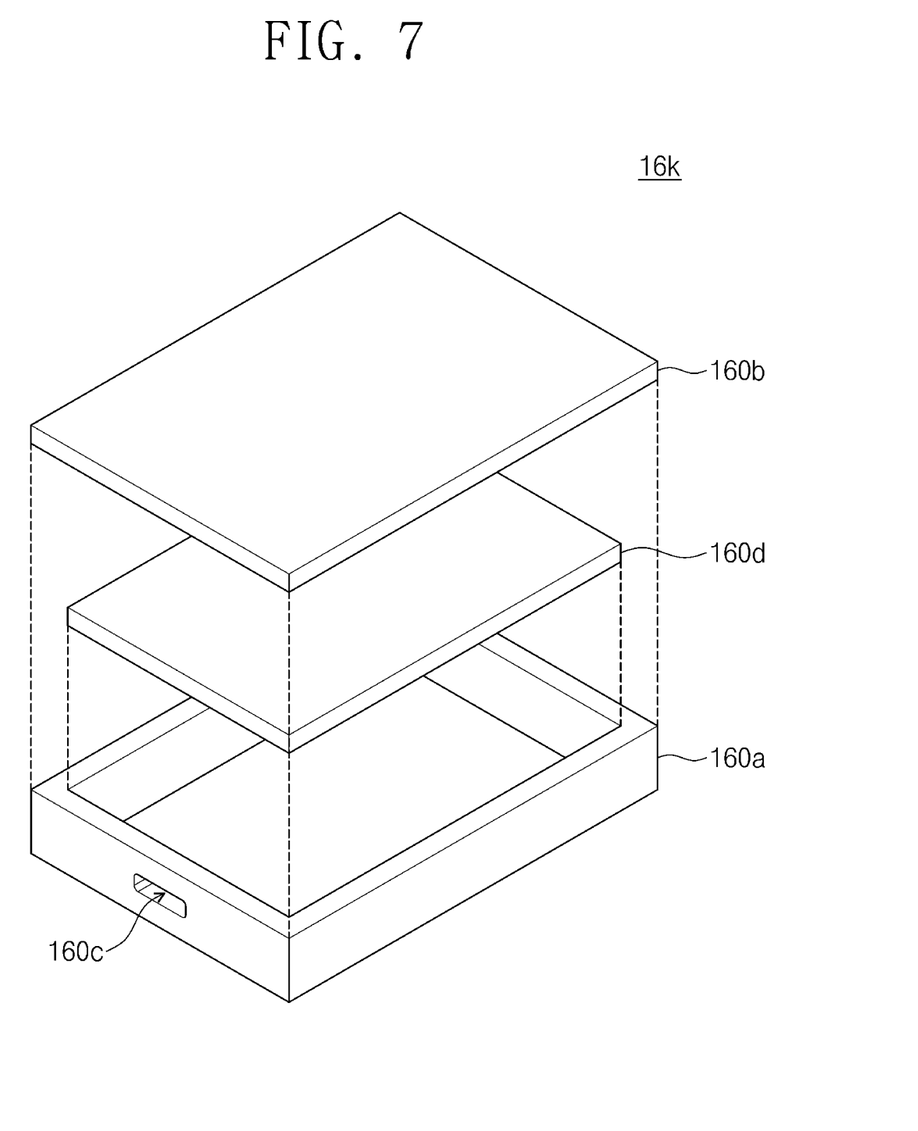
FIG. 7 illustrates an example of an indicator capable of being reversibly discolored according to humidity.

FIG. 7 illustrates an example of an indicator 16k capable of being reversibly discolored based on humidity surrounding the semiconductor module 100 or the semiconductor packages 120. Referring to FIG. 7, an indicator 16k may include a color-changeable material 160d surrounded by a bottom plate 160a and a top plate 160b. The color-changeable material 160d may be discolored when humidity reaches a critical value. The bottom plate 160a and the top plate 160b may block or prevent evaporation of moisture absorbed in the color-changeable material 160d. At least one of the bottom plate 160a or the top plate 160b may be formed of a transparent material to visibly show the humidity level indicated on the color-changeable material 160d. An opening 160c for delivering the humidity of the external environment to the color-changeable material 160d may be provided in the bottom plate 160a. However, the example embodiment is not limited thereto. The opening 160c for delivering the humidity of the external environment to the color-changeable material 160d may be provided in the top plate 160b.

Referring again to FIG. 6, the plurality of indicators 161 to 16m may be discolored by the same method as described with reference to FIGS. 4 and 5, and thus the detailed descriptions thereto will be omitted.

For example, the plurality of indicators 161 to 16m may include cobalt chlorides or anhydrous copper sulfates, which have critical values different from each other. However, materials of the indicators 161 to 16m discolored according to humidity are not limited to cobalt chlorides or anhydrous copper sulfates.

In FIGS. 6 and 7, the non-electric humidity indicator 160 or 16k shows a degree of the increase in the ambient humidity. Alternatively, in certain example embodiments, the non-electric humidity indicator 160 or 16k may show a degree of a decrease in the ambient humidity. For example, the non-electric humidity indicator 160 or 16k may include a plurality of indicators sequentially discolored as the ambient humidity decreases. In certain example embodiments, the non-electric humidity indicator 160 may be applied to show both information on an increasing ambient humidity and information on a decreasing ambient humidity. For example, the non-electric humidity indicator 160 may include a plurality of first indicators and a plurality of second indicators. The plurality of first indicators may be sequentially discolored as the ambient humidity increases, and the plurality of second indicators may be sequentially discolored as the ambient humidity decreases.

Figure 8:
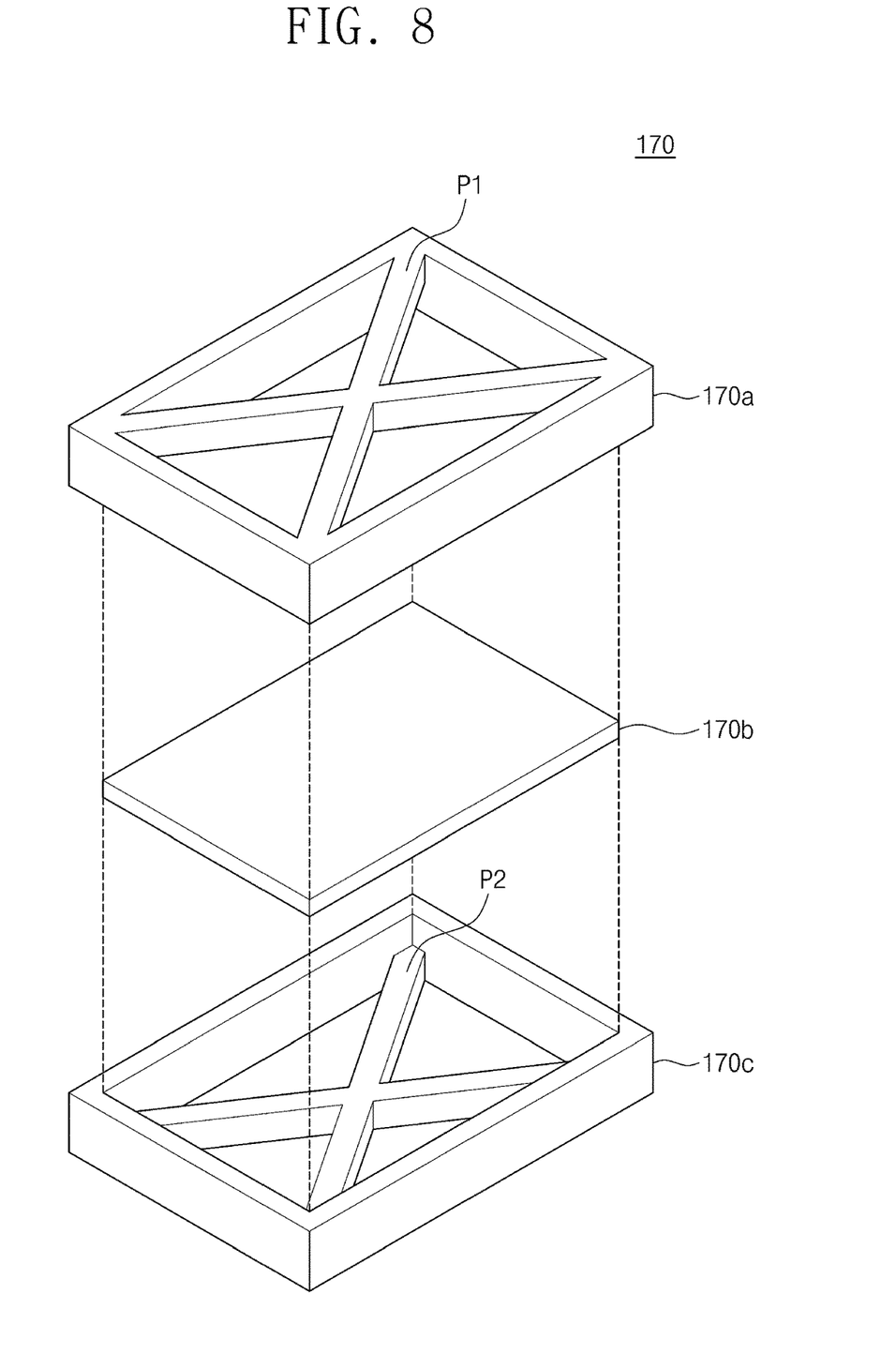
FIG. 8 illustrates an example of an X-ray exposure indicator of FIG. 2.

FIG. 8 illustrates an example of the X-ray exposure indicator 170 illustrated in FIG. 2. Referring to FIG. 8, the X-ray exposure indicator 170 may include a top surface cap 170a, an X-ray film (or an emulsion) 170b, and a bottom surface cap 170c. The top surface cap 170a may be attached to a top surface of the X-ray film 170b. By a first pattern P1, the top surface cap 170a may expose a portion of the X-ray film 170b and may not expose a remaining portion of the X-ray film 170b. For example, in the example embodiment, the first pattern P1 of the top surface cap 170a may have an X-shape as illustrated in FIG. 8. The bottom surface cap 170c may be attached to a bottom surface of the X-ray film 170b. By a second pattern P2, the bottom surface cap 170c may expose a portion of the X-ray film 170b and may not expose a remaining portion of the X-ray film 170b. For example, in the example embodiment, the second pattern P2 of the bottom surface cap 170c may have an X-shape as illustrated in FIG. 8.

A transmittance of the top surface cap 170a or the bottom surface cap 170c to an X-ray may be determined according to a flux of an X-ray which the semiconductor module 100 or the semiconductor packages 120 can experience. For example, the top surface cap 170a or the bottom surface cap 170c may have a transmittance of 30% to 70% with respect to a flux of an X-ray generally used in an X-ray scanner of a customhouse.

When an X-ray is irradiated to the X-ray film 170b through the top surface cap 170a, exposure corresponding to the first pattern P1 of the top surface cap 170a may occur on the top surface of the X-ray film 170b. When an X-ray is irradiated to the X-ray film 170b through the bottom surface cap 170c, exposure corresponding to the second pattern P2 of the bottom surface cap 170c may occur on the bottom surface of the X-ray film 170b. When the X-ray film 170b is printed, whether the X-ray is irradiated to the top surface or the bottom surface of the X-ray film 170b may be determined according to whether the first pattern or the second pattern P2 is shown on the X-ray film 170b. In other words, the X-ray exposure indicator 170 may be an X-ray sensitive indicator for sensing and indicating whether an X-ray is irradiated to the semiconductor module 100 or the semiconductor packages 120.

Figure 9:
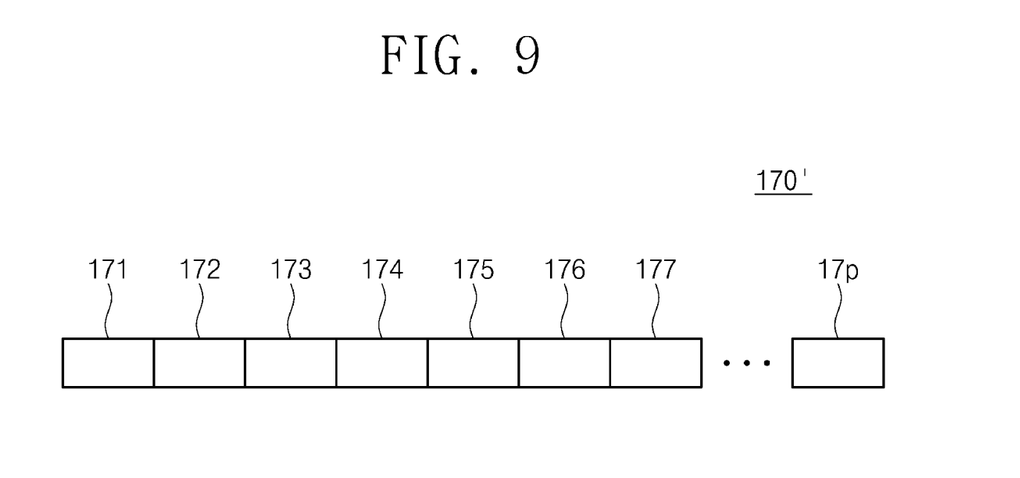
FIG. 9 illustrates an example of an X-ray exposure indicator including a plurality of indicators.

FIG. 9 illustrates an example of an X-ray exposure indicator 170' including a plurality of indicators 171 to 17p (where "p" denotes a positive integer). Each of the plurality of indicators (or X-ray sensitive indicators) 171 to 17p may have the same structure as described with reference to FIG. 8. Transmittances of the caps of the plurality of indicators 171 to 17p may be different from each other. For example, the transmittance of the caps of a $k^{th}$ indicator (where "k" is a positive integer greater than 1 and equal to or less than "p") may be lower than the transmittance of the caps of a $k-1^{th}$ indicator. The plurality of indicators 171 to 17p may indicate or show a flux of an irradiated X-ray through shown patterns of the X-ray films 170b.

Figure 10:
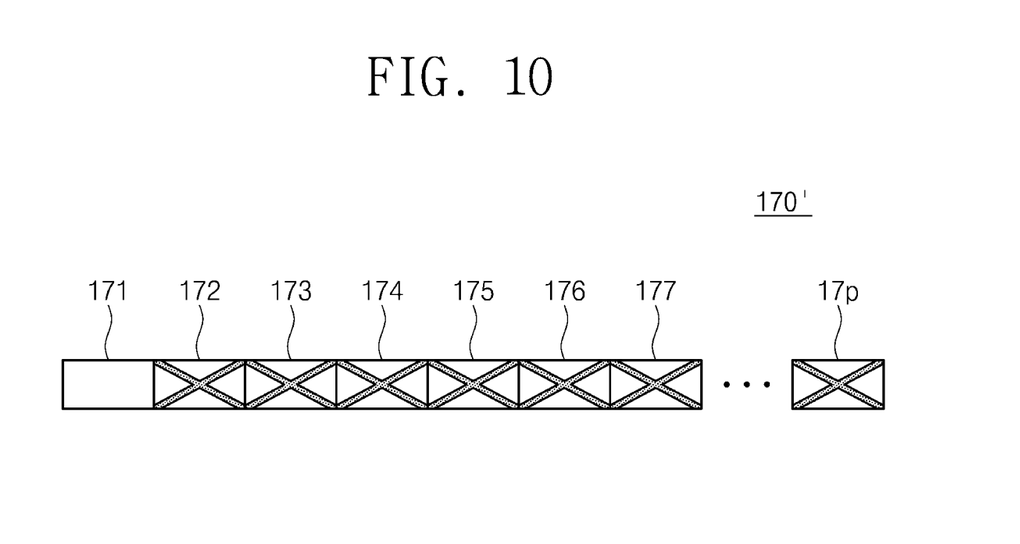
FIG. 10 illustrates an example in which patterns are shown in the plurality of indicators of an X-ray exposure indicator shown in FIG. 9.

FIG. 10 illustrates an example in which patterns are shown in the plurality of indicators 171 to 17p of the X-ray exposure indicator 170' shown in FIG. 9. Referring to FIG. 10, when the plurality of indicators 171 to 17p are developed, a pattern may not be shown in a first indicator 171 but patterns may be shown in second to $p^{th}$ indicators 172 to 17p. In this case, a flux of the X-ray irradiated to the semiconductor module 100 or the semiconductor packages 120 may be determined to be strong enough to disregard the transmittances of the caps of the first indicator 171 and to be weak enough not to disregard the transmittances of the caps of the second to $p^{th}$ indicators 172 to 17p.

Figure 11:
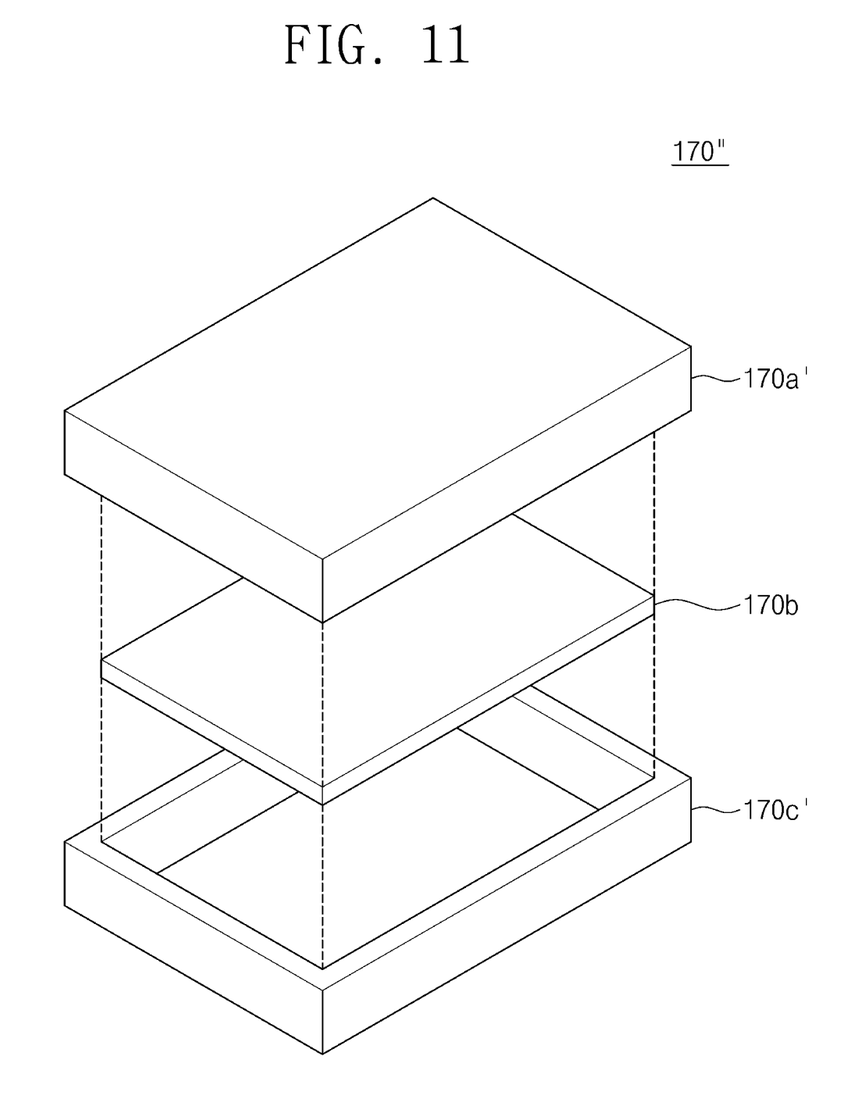
FIG. 11 illustrates an example of an X-ray exposure indicator of FIG. 2.

FIG. 11 illustrates an example of an X-ray exposure indicator 170" of FIG. 2. As compared to FIG. 8, a top surface cap 170a' and a bottom surface cap 170c' of the non-electric X-ray exposure indicator 170" may not have a pattern. The top surface cap 170a' and the bottom surface cap 170c' may seal the X-ray film 170b (or a material including an emulsion). The top surface cap 170a' and the bottom surface cap 170c' may function as a filter for blocking light having low permeability, such as visible light and infrared light. The top surface cap 170a' and the bottom surface cap 170c' may have suitable transmittances of, for example, 30% to 70% with respect to an X-ray.

When the non-electric X-ray exposure indicator 170" is used alone, whether an X-ray is irradiated to the semiconductor module 100 or the semiconductor packages 120 may be determined according to whether the X-ray film 170b is blackened.

When a plurality of indicators is used like FIGS. 9 and 10, transmittances of the caps of the plurality of indicators may be different from each other. As described with reference to FIGS. 4 and 5, the flux of the X-ray irradiated to the semiconductor module 100 or the semiconductor packages 120 may be determined according to blackened ones and non-blackened ones of the plurality of indicators.

Figure 12:
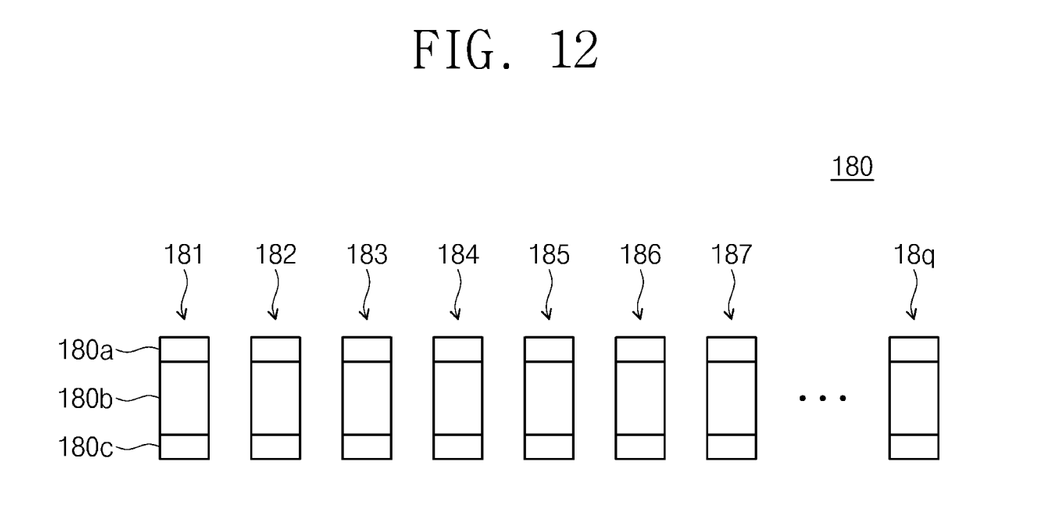
FIG. 12 illustrates an example of a non-electric EOS indicator of FIG. 2.

FIG. 12 illustrates an example of the non-electric EOS indicator 180 illustrated in FIG. 2. Referring to FIG. 12, the non-electric EOS indicator 180 may include a plurality of indicators 181 to 18q (where "q" denotes a positive integer). Each of the plurality of indicators 181 to 18q may be a fuse that is blown when a current of a critical value or more flows. Each of the plurality of indicators 181 to 18q may include a first electrode 180a, a body 180b and a second electrode 180c. The body 180b may include a fuse connecting the first and second electrodes 180a and 180c and a housing surrounding the fuse (not shown). The critical values of the plurality of indicators 181 to 18q may be different from one another. The critical value of a $k^{th}$ indicator (where "k" is a positive integer greater than 1 and equal to or less than "q") may be greater than the critical value of a $k-1^{th}$ indicator. In other words, the plurality of indicators 181 to 18q may be sequentially blown as EOS applied to the semiconductor module 100 or the semiconductor packages 120 increases. In other words, a magnitude of the greatest (or worst) EOS applied to the semiconductor module 100 or the semiconductor packages 120 may be determined by identifying blown ones and non-blown ones of the plurality of indicators 181 to 18q.

For example, high temperature may occur when each of the indicators 181 to 18q is blown. The plurality of indicators 181 to 18q may be painted or coated with thermochromic inks (or thermosensitive inks) to visibly show a blown degree of the plurality of indicators 181 to 18q. Each of the thermochromic inks (or thermosensitive inks) may have a critical value similar to or lower than the temperature of heat occurring when each of the indicators 181 to 18q is blown. In other words, the blown ones of the indicators 181 to 18q may have discolored colors, and non-blown ones of the indicators 181 to 18q may have their original colors before being discolored.

Figure 13:
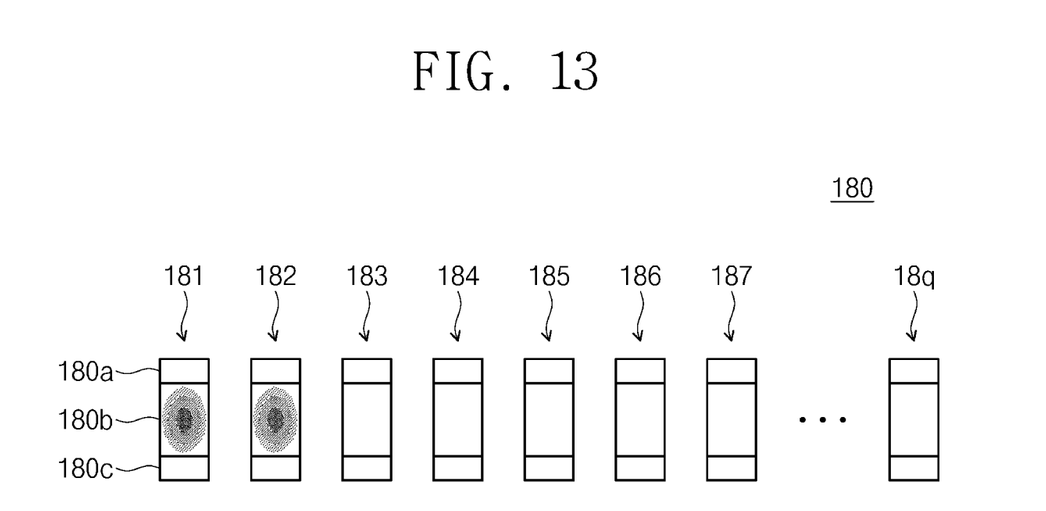
FIG. 13 illustrates an example in which a plurality of indicators of FIG. 12 is discolored.

FIG. 13 illustrates an example of a non-electric EOS indicator 180 in which the indicators 181 to 18q of FIG. 12 are discolored. Referring to FIG. 13, first and second indicators 181 and 182 may be discolored, and the original colors of third to $q^{th}$ indicators 183 to 18q may be unchanged. In other words, it may be visibly identified that the fuses of the first and second indicators 181 and 182 are blown and the third to $q^{th}$ indicators 183 to 18q are not blown.

Figure 14:
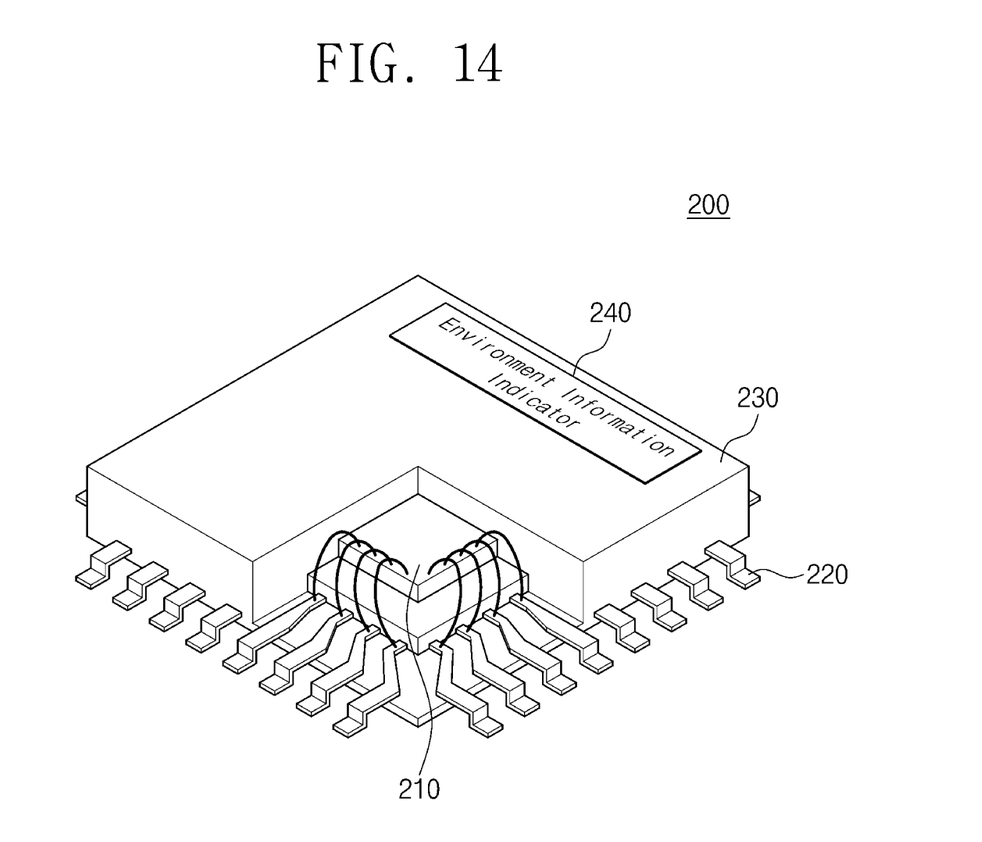
FIG. 14 illustrates a semiconductor package according to some embodiments of the inventive concepts.

FIG. 14 illustrates a semiconductor package 200 according to an example embodiment of the inventive concepts. Referring to FIG. 14, the semiconductor package 200 may include a semiconductor die 210, a housing 230, conductive materials 220, and an environment information indicator 240.

The semiconductor die 210 may include one or more dies. The one or more dies of the semiconductor die 210 may include the same kind or may include different kinds of dies from one another. The semiconductor die 210 may be stacked vertically or stepwise.

The housing 230 may surround the semiconductor die 210 and may protect the semiconductor die 210. The conductive materials 220 may penetrate the housing 230 so as to be connected to the semiconductor die 210. The conductive materials 220 may provide communication channels between the semiconductor die 210 and a printed circuit board or slot at which the semiconductor package 200 is mounted. The conductive materials 220 may include connection pins or solder balls.

The environment information indicator 240 may be the same as the environment information indicator 140 described with reference to FIGS. 1 to 13. The environment information indicator 240 may display information related to an environment which the individual semiconductor package 200 experiences. Thus, a distribution environment or a use environment of the semiconductor package 200 may be identified, and reliability of the semiconductor package 200 may be improved by improving the identified environments.

According to example embodiments of the inventive concepts, the information on the environment experienced by the semiconductor module or the semiconductor package may be obtained and shown in the non-electric manner. Thus, the influence of the environment on the semiconductor module or the semiconductor package may be identified to determine whether or not a cause of a defect of the semiconductor module or the semiconductor package is due to the distribution process thereof.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor module comprising:
a plurality of semiconductor packages provided on a substrate; and
an environment information indicator provided on the substrate and configured to collect and display information related to surroundings of the plurality of semiconductor packages,
wherein the environment information indicator includes a temperature indicator including a plurality of indicators,
wherein the plurality of indicators have different critical values,
wherein the temperature indicator is configured to indicate a highest temperature affecting the semiconductor module after the temperature indicator being provided on the substrate by irreversibly changing respective color of each the plurality of indicators having the different critical values when an ambient temperature exceed respective critical values of each of the plurality of indicators, and
wherein the environment information indicator further includes an X-ray indicator that comprises:
an X-ray film; and
a first cap attached to a first surface of the X-ray film, the first cap exposing a portion of the first surface of the X-ray film through a first pattern.

2. The semiconductor module of claim 1, wherein the information related to the surroundings of the plurality of semiconductor packages comprises:
information related to humidity of the surroundings of the plurality of semiconductor packages;
information related to an X-ray of the surroundings being irradiated to the plurality of semiconductor packages; and
information related to electrical overstress (EOS) of the surroundings being applied to the plurality of semiconductor packages.

3. The semiconductor module of claim 1, wherein the environment information indicator comprises a plurality of first type indicators configured to display a first type of information related to the surroundings of the plurality of semiconductor packages based on information collected by the plurality of first type indicators.

4. The semiconductor module of claim 3, wherein the plurality of first type indicators comprise a first indicator and a second indicator,
wherein the first indicator has a first critical value, the first indicator changing a display color of the first indicator based on a first comparison between the first critical value and the first type of information,
wherein the second indicator has a second critical value, the second indicator changing a display color of the second indicator based on a second comparison between the first critical value and the first type of information, and
wherein the first critical value and the second critical value are different from each other.

5. The semiconductor module of claim 4, wherein the first and second indicators irreversibly change the display color of the first indicator and the display color of the second indicator.

6. The semiconductor module of claim 4, wherein the first and second indicators reversibly change the display color of the first indicator and the display color of the second indicator.

7. The semiconductor module of claim 1, wherein the environment information indicator further comprises a plurality of information indicators collecting and displaying different information of the surroundings, and
wherein at least one of the plurality of information indicators in configured to change the displayed information of the at least one of the plurality of information indicators irreversibly, and at least another one of the plurality of indicators is configured to change the displayed information of the at least another one of the plurality of information indicators reversibly.

8. A semiconductor module comprising:
a plurality of semiconductor packages provided on a substrate; and
an environment information indicator provided on the substrate and configured to collect and display information related to surroundings of the plurality of semiconductor packages,
wherein the environment information indicator includes an electrical overstress (EOS) indicator,
wherein the EOS indicator comprises:
a plurality of fuses having different critical values of currents to be disconnected; and
a plurality of temperature indicators coupled to the plurality of fuses respectively,
wherein the EOS indicator is configured to visibly indicate a highest EOS affecting the semiconductor module after the EOS indicator being provided on the substrate by irreversibly changing respective color of each the plurality of temperature indicators based on a heat generated when each of the plurality of fuses having the different critical values of currents to be disconnected is disconnected, wherein the environment information indicator further includes an X-ray indicator, and wherein the X-ray indicator comprises:
an X-ray film; and
a first cap attached to a first surface of the X-ray film, the first cap exposing a portion of the first surface of the X-ray film through a first pattern.

* * * * *